US011527600B2

(12) United States Patent
Kim et al.

(10) Patent No.: US 11,527,600 B2
(45) Date of Patent: Dec. 13, 2022

(54) DISPLAY DEVICE

(71) Applicant: Samsung Display Co., Ltd., Yongin-Si (KR)

(72) Inventors: Hyeongseok Kim, Hwaseong-si (KR); Minjoo Kim, Bucheon-si (KR); Seulgi Kim, Busan (KR); Soohyun Moon, Incheon (KR); Jaeyong Jang, Seoul (KR); Chong Chul Chai, Seoul (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 248 days.

(21) Appl. No.: 16/701,836

(22) Filed: Dec. 3, 2019

(65) Prior Publication Data

US 2020/0227505 A1 Jul. 16, 2020

(30) Foreign Application Priority Data

Jan. 15, 2019 (KR) .................. 10-2019-0005066

(51) Int. Cl.
*H01L 27/32* (2006.01)
*H01L 51/00* (2006.01)

(52) U.S. Cl.
CPC ...... *H01L 27/3276* (2013.01); *H01L 51/0096* (2013.01)

(58) Field of Classification Search
CPC ................................................. H01L 27/3276
See application file for complete search history.

(56) References Cited

U.S. PATENT DOCUMENTS 7,830,591 B2  11/2010  Shimodaira
9,991,474 B2  6/2018  Kim et al.
2017/0294502 A1  10/2017  Ka et al.
2020/0064702 A1*  2/2020  Yeh ................. G09G 3/20
2020/0176542 A1*  6/2020  Park ................. H01L 51/0096
2021/0126020 A1  4/2021  Kim et al.
2021/0210585 A1  7/2021  Lee et al.

FOREIGN PATENT DOCUMENTS

EP  3236309 A1  10/2017
EP  3564999 A1  11/2019
EP  3648093 A1  5/2020
KR  1020180030363 A  3/2018

OTHER PUBLICATIONS

Extended European Search Report for Application No. 20151576.4-1211 dated Jun. 12, 2020.
European Office Action for Application No. 20 151 576.4-1211 dated Apr. 19, 2022 enumerating the above listed references.

* cited by examiner

*Primary Examiner* — Monica D Harrison
*Assistant Examiner* — Molly K Reida
(74) *Attorney, Agent, or Firm* — Cantor Colburn LLP

(57) ABSTRACT

A display device may include a substrate in which an opening is defined, a first disconnected line disposed on the substrate, the first disconnected line extending along a first direction and including a first disconnected portion and a second disconnected portion, and the first disconnected portion and the second disconnected portion being disconnected from each other by the opening, and a first bypass line disposed on the substrate in a different layer from the first disconnected line, the first bypass line bypassing the opening and connecting the first disconnected portion and the second disconnected portion to each other.

22 Claims, 11 Drawing Sheets

DISPLAY DEVICE

This application claims priority to Korean Patent Application No. 10-2019-0005066 filed on Jan. 15, 2019, and all the benefits accruing therefrom under 35 U.S.C. § 119, the content of which in its entirety is herein incorporated by reference.

BACKGROUND

1. Field

Embodiments relate to a display device. More particularly, embodiments related to a display device in which an opening is defined inside a display area.

2. Description of the Related Art

Display devices typically include a liquid crystal display ("LCD"), a plasma display panel ("PDP"), an organic light emitting diode ("OLED") device, a field effect display ("FED"), and an electrophoretic display device, for example.

An OLED device typically includes two electrodes and an organic light emitting layer located therebetween. In the organic light emitting layer, electrons injected from one electrode and holes injected from the other electrode are combined to form excitons, and the excitons emit light through energy emission.

The OLED device has self-luminance characteristics and may not include a separate light source, which is typically included in the LCD, so that the thickness and weight thereof may be less than that of the LCD. Furthermore, the OLED device attracts attention as a next-generation display device because of desired characteristics of the OLED device such as low power consumption, high brightness, and high response speed.

Recently, display devices have been developed to have a wider display area and a narrow bezel area that is a non-display area outside the display area.

SUMMARY

Embodiments provide a display device in which a dead space is reduced.

An embodiment of a display device includes a substrate in which an opening is defined, a first disconnected line disposed on the substrate, the first disconnected line extending along a first direction and including a first disconnected portion and a second disconnected portion, and the first disconnected portion and the second disconnected portion being disconnected from each other by the opening, and a first bypass line disposed on the substrate in a different layer from the first disconnected line, the first bypass line bypassing the opening and connecting the first disconnected portion and the second disconnected portion to each other.

In an embodiment, the first bypass line may include a first bypass portion extending along a second direction crossing the first direction, the first bypass portion being connected to the first disconnected portion, a second bypass portion extending along the second direction, the second bypass portion being connected to the second disconnected portion, and a third bypass portion extending along the first direction, the third bypass portion connecting the first bypass portion and the second bypass portion.

In an embodiment, the display device may further include a connected line disposed on the substrate in a same layer as the first disconnected line, the connected line extending along the first direction and not being disconnected by the opening. In such an embodiment, the third bypass portion may overlap the connected line.

In an embodiment, the connected line may transmit a direct current voltage.

In an embodiment, the first disconnected line may be a scan line, an emission control line, or an initialization voltage line.

In an embodiment, the display device may further include a second disconnected line disposed on the substrate in a different layer from the first disconnected line, the second disconnected line extending along a second direction crossing the first direction and including a third disconnected portion and a fourth disconnected portion, and the third disconnected portion and the fourth disconnected portion being disconnected from each other by the opening, and a second bypass line disposed on the substrate in a different layer from the second disconnected line, the second bypass line bypassing the opening and connecting the third disconnected portion and the fourth disconnected portion to each other.

In an embodiment, the second bypass line may include a fourth bypass portion extending along the first direction, the fourth bypass portion being connected to the third disconnected portion, a fifth bypass portion extending along the first direction, the fifth bypass portion being connected to the fourth disconnected portion, and a sixth bypass portion extending along the second direction, the sixth bypass portion connecting the fourth bypass portion and the fifth bypass portion to each other.

In an embodiment, the display device may further include a connected line disposed on the substrate in a same layer as the second disconnected line, the connected line extending along the second direction and not being disconnected by the opening. In such an embodiment, the sixth bypass portion may overlap the connected line.

In an embodiment, the connected line may transmit a direct current voltage.

In an embodiment, the second disconnected line may be a data line or a driving voltage line.

In an embodiment, the second bypass line may be disposed on the substrate in a same layer as the first bypass line.

In an embodiment, a length of the second bypass line may be greater than a length of the first bypass line.

In an embodiment, the display device may further include a first conductive layer, a first insulation layer, a second conductive layer, a second insulation layer and a third conductive layer, which are sequentially stacked one on another on the substrate. In such an embodiment, the first conductive layer may include the first disconnected line, and the third conductive layer may include the first bypass line.

In an embodiment, the second conductive layer may include the second disconnected line, and the third conductive layer may further include the second bypass line.

An embodiment of a display device includes a substrate in which an opening is defined, a first line disposed on the substrate, the first line extending along a first direction and including a first disconnected line and a first connected line, the first disconnected line being disconnected from each other by the opening, and the first connected line not being disconnected by the opening, and a first bypass line disposed on the substrate in a different layer from the first line, the first bypass line bypassing the opening and connecting the first disconnected line.

In an embodiment, the first disconnected line may include a first disconnected portion and a second disconnected portion which are spaced apart from each other with the opening therebetween, and the first bypass line may include a first bypass portion extending along a second direction crossing the first direction, the first bypass portion being connected to the first disconnected portion, a second bypass portion extending along the second direction, the second bypass portion being connected to the second disconnected portion, and a third bypass portion extending along the first direction, the third bypass portion connecting the first bypass portion and the second bypass portion to each other.

In an embodiment, the third bypass portion may overlap the first connected line.

In an embodiment, the display device may further include a second line disposed on the substrate in a different layer from the first line, the second line extending along a second direction crossing the first direction and including a second disconnected line and a second connected line, the second disconnected line being disconnected by the opening, and the second connected line not being disconnected by the opening, and a second bypass line disposed on the substrate in a different layer from the second line, the second bypass line bypassing the opening and connecting the second disconnected line.

In an embodiment, the second disconnected line may include a third disconnected portion and a fourth disconnected portion which are spaced apart from each other with the opening therebetween, and the second bypass line may include a fourth bypass portion extending along the first direction, the fourth bypass portion being connected to the third disconnected portion, a fifth bypass portion extending along the first direction, the fifth bypass portion being connected to the fourth disconnected portion, and a sixth bypass portion extending along the second direction, the sixth bypass portion connecting the fourth bypass portion and the fifth bypass portion to each other.

In an embodiment, the sixth bypass portion may overlap the second connected line.

In an embodiment, the display device may further include a first conductive layer, a first insulation layer, a second conductive layer, a second insulation layer and a third conductive layer which are sequentially stacked one on another on the substrate. In such an embodiment, the first conductive layer may include the first line, and the third conductive layer may include the first bypass line.

In an embodiment, the second conductive layer may include the second line, and the third conductive layer may further include the second bypass line.

In such embodiments of the display device according to the invention, the first disconnected line disconnected by the opening may be connected to each other by the first bypass line disposed on the substrate in a different layer from the first disconnected line and bypassing the opening. Accordingly, a dead space due to the first bypass line around the opening may be reduced.

In such embodiments, the first bypass line may overlap the first connected line disposed on the substrate in a same layer as the first disconnected line, not being disconnected by the opening, and transmitting a direct current voltage. Therefore, an electrical coupling between the first bypass line and the first connected line may be effectively prevented.

BRIEF DESCRIPTION OF THE DRAWINGS

The above and other features of the invention will become more apparent by describing in further detail exemplary embodiments thereof with reference to the accompanying drawings, in which.

DETAILED DESCRIPTION

Figure 1:
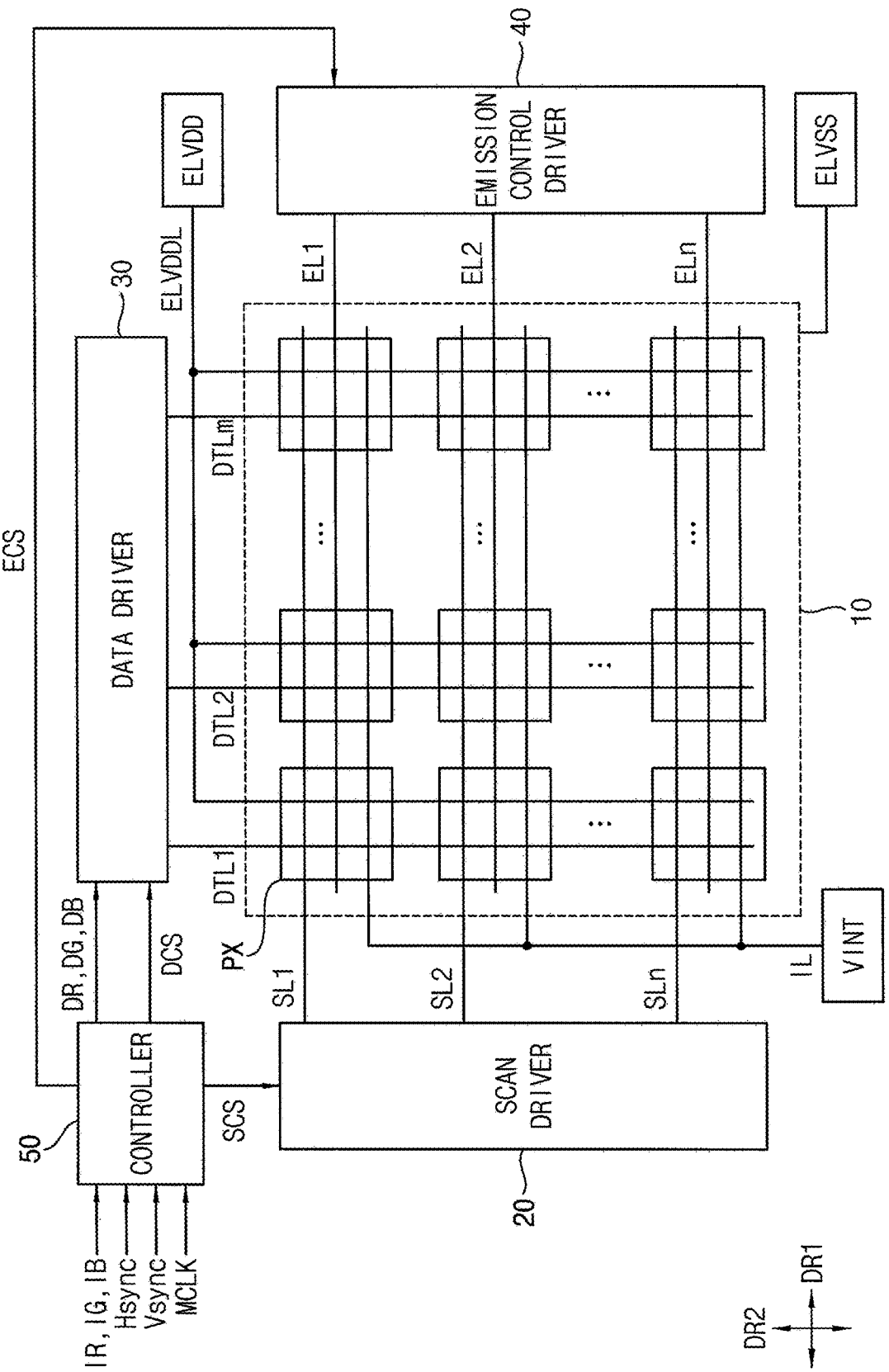
FIG. 1 is a block diagram illustrating a display device according to an embodiment.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." "At least one of A and B" means "A and/or B." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system).

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the claims.

Hereinafter, embodiment of a display device in accordance with the invention will be described in detail with reference to the accompanying drawings.

FIG. 1 is a block diagram illustrating a display device according to an embodiment.

Referring to FIG. 1, an embodiment of a display device may include a display unit 10, a scan driver 20, a data driver 30, an emission control driver 40, and a controller 50.

The display unit 10 may be disposed in a display area, and may include a plurality of pixels PX at intersections of a plurality of scan lines SL1 through SLn, a plurality of data lines DTL1 through DTLm, and a plurality of emission control lines EL1 through ELn. The pixels PX may be arranged in a substantial matrix form. The scan lines SL1 through SLn, the emission control lines EL1 through ELn, and an initialization voltage line IL may extend along a first direction DR1, which is a row direction of the pixels PX, and the data lines DTL1 through DTLm and a driving voltage line ELVDDL may extend along a second direction DR2, which is a column direction of the pixels PX.

Each pixel PX may be connected to at least one corresponding scan line among the scan lines SL1 through SLn. The scan driver 20 may transmit a scan signal to each pixel PX via the scan lines SL1 through SLn.

Each pixel PX may be connected to a corresponding data line (e.g., a single data line) among the data lines DTL1 through DTLm. The data driver 30 may transmit a data signal to each pixel PX via the data lines DTL1 through DTLm. When the scan signal is provided to the scan lines SL1 through SLn, the data signal may be provided to pixels PX selected by the scan signal.

Each pixel PX may be connected to a corresponding emission control line (e.g., a single emission control line) among the emission control lines EL1 through ELn. The emission control driver 40 may transmit an emission control signal to each pixel PX via the emission control lines EL1 through ELn. The emission control signal may control an emission timing or an emission time period of each pixel PX. Alternatively, the emission control driver 40 may be omitted according to internal structures of the pixels PX.

The controller 50 may change a plurality of externally-received image signals IR, IG and IB into a plurality of image data signals DR, DG and DB, and may transmit the image data signals DR, DG and DB to the data driver 30. The controller 50 may receive a vertical synchronization signal Vsync, a horizontal synchronization signal Hsync, and a clock signal MCLK. The controller 50 may generate control signals for respectively controlling the scan driver 20, the data driver 30 and the emission control driver 40, and may transmit the generated control signals to the scan driver 20, the data driver 30 and the emission control driver 40, respectively. In one embodiment, for example, the controller 50 may generate a scan driving control signal SCS for controlling the scan driver 20, a data driving control signal DCS for controlling the data driver 30, and an emission driving control signal ECS for controlling the emission control driver 40, and may transmit the scan driving control signal SCS, the data driving control signal DCS and the emission driving control signal ECS to the scan driver 20, the data driver 30 and the emission control driver 40, respectively.

Each pixel PX may receive a driving voltage ELVDD and a common voltage ELVSS from an outside. The driving voltage ELVDD may be a predetermined high-level voltage. The common voltage ELVSS may be a voltage lower than the driving voltage ELVDD, or may be a ground voltage. The driving voltage ELVDD may be provided to each pixel PX via a driving voltage line ELVDDL. The initialization voltage line IL may receive an initialization voltage VINT from an external power source, and may provide the initialization voltage VINT to each pixel PX.

Each pixel PX may emit light with a brightness corresponding to driving currents that are provided to respective display elements, based on the data signals received via the data lines DTL1 through DTLm. Hereinafter, embodiments where a display device includes an organic light emitting element as a display element will be described for convenience of the description. However, embodiments of the invention are not limited thereto, and such embodiments may be applied to various types of display device such as a liquid crystal display device, an electrophoretic display device, etc.

Figure 2:
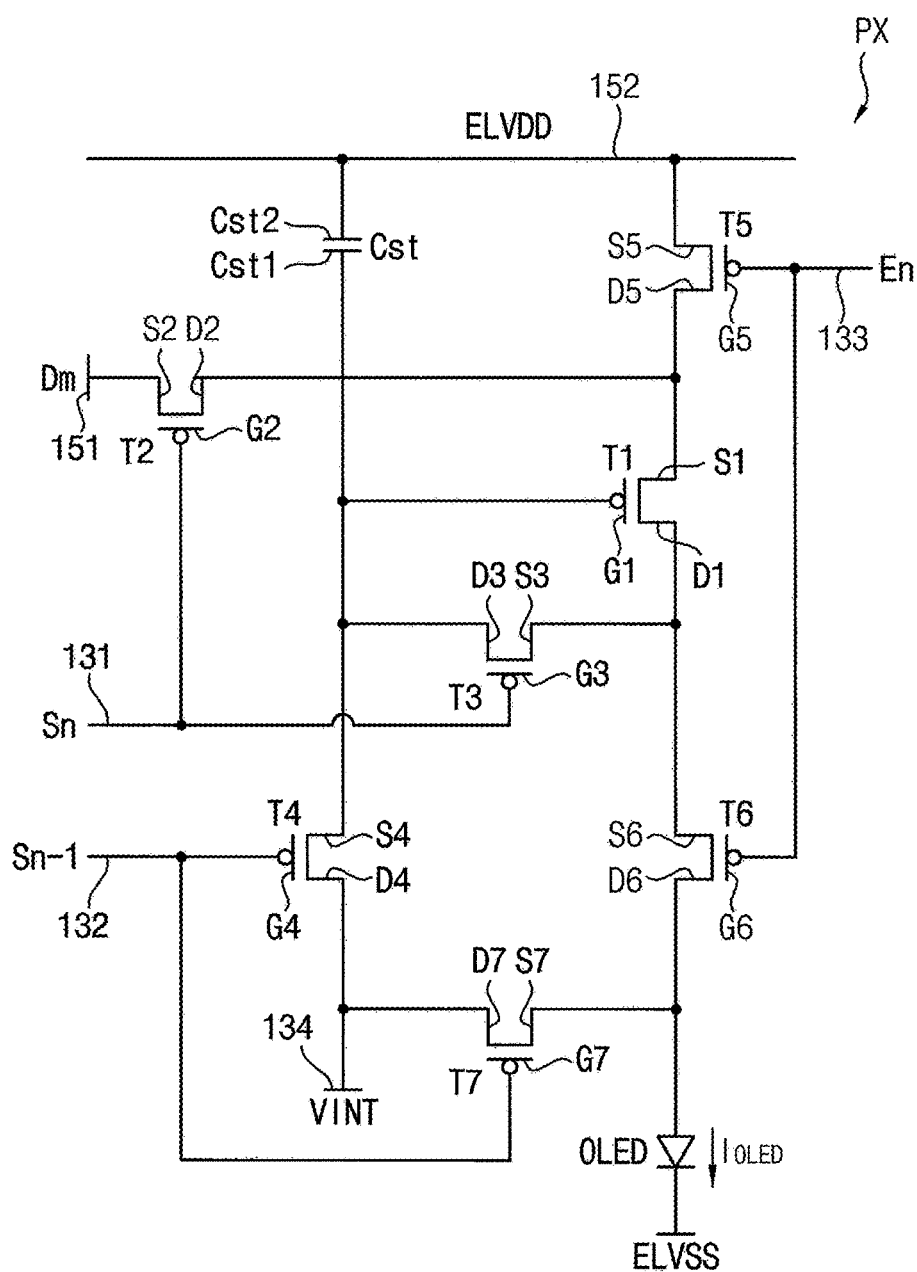
FIG. 2 is a circuit diagram illustrating an embodiment of a pixel of the display device in FIG. 1.

FIG. 2 is a circuit diagram illustrating an embodiment of the pixel PX of the display device in FIG. 1.

Referring to FIG. 2, each pixel PX of the display device may include a plurality of transistors T1, T2, T3, T4, T5, T6 and T7, a storage capacitor Cst, an organic light emitting element OLED, and a plurality of signal lines 131, 132, 133, 134, 151 and 152, which is connected to the transistors T1, T2, T3, T4, T5, T6 and T7, the storage capacitor Cst and the organic light emitting element OLED.

The transistors T1, T2, T3, T4, T5, T6 and T7 may include a driving transistor T1, a switching transistor T2, a compensation transistor T3, a first initialization transistor T4, an operation control transistor T5, an emission control transistor T6, and a second initialization transistor T7.

The signal lines 131, 132, 133, 134, 151 and 152 may include a scan line 131 for transmitting a scan signal Sn, a previous scan line 132 for transmitting a previous scan signal Sn−1, an emission control line 133 for transmitting an emission control signal En, an initialization voltage line 134 for transmitting an initialization voltage VINT to initialize the driving transistor T1 and an anode of the organic light emitting element OLED, a data line 151 for transmitting a data signal Dm, and a driving voltage line 152 for transmitting a driving voltage ELVDD. The previous scan line 132 may be parallel to the scan line 131, the emission control line 133 may be parallel to the previous scan line 132, the initialization voltage line 134 may be parallel to the emission control line 133, the data line 151 may cross the scan line 131, and the driving voltage line 152 may be parallel to the data line 151.

A driving gate electrode G1 of the driving transistor T1 may be connected to a first electrode Cst1 of the storage capacitor Cst, a driving source electrode S1 of the driving transistor T1 may be connected to the driving voltage line 152 via the operation control transistor T5, and a driving drain electrode D1 of the driving transistor T1 may be electrically connected to the anode of the organic light emitting element OLED via the emission control transistor T6. The driving transistor T1 may receive the data signal Dm based on a switching operation of the switching transistor T2, and may provide a driving current $I_{OLED}$ to the organic light emitting element OLED.

A switching gate electrode G2 of the switching transistor T2 may be connected to the scan line 131, a switching source electrode S2 of the switching transistor T2 may be connected to the data line 151, and a switching drain electrode D2 of the switching transistor T2 may be connected to the driving source electrode S1 of the driving transistor T1 and connected to the driving voltage line 152 via the operation control transistor T5. The switching transistor T2 may be turned on according to the scan signal Sn receiving through the scan line 131, and may perform the switching operation for transmitting the data signal Dm, which is applied thereto through the data line 151, to the driving source electrode S1 of the driving transistor T1.

A compensation gate electrode G3 of the compensation transistor T3 may be connected to the scan line 131, a compensation source electrode S3 of the compensation transistor T3 may be connected to the driving drain electrode D1 of the driving transistor T1 and connected to the anode of the organic light emitting element OLED via the emission control transistor T6, and a compensation drain electrode D3 of the compensation transistor T3 may be connected to the first electrode Cst1 of the storage capacitor Cst, a first initialization source electrode S4 of the first initialization transistor T4 and the driving gate electrode G1 of the driving transistor T1. The compensation transistor T3 may be turned on in response to the scan signal Sn applied thereto through the scan line 131, and may diode-connect the driving transistor T1 by electrically connecting the driving gate electrode G1 and the driving drain electrode D1 of the driving transistor T1.

A first initialization gate electrode G4 of the first initialization transistor T4 may be connected to the previous scan line 132, a first initialization drain electrode D4 of the first initialization transistor T4 may be connected to a second initialization drain electrode D7 of the second initialization transistor T7 and the initialization voltage line 134, and a first initialization source electrode S4 of the first initialization transistor T4 may be connected to the first electrode Cst1 of the storage capacitor Cst, the compensation drain electrode D3 of the compensation transistor T3 and the driving gate electrode G1 of the driving transistor T1. The first initialization transistor T4 may be turned on in response to the previous scan signal Sn−1 applied thereto through the previous scan line 132, and may perform an initialization operation for initializing a voltage of the driving gate electrode G1 of the driving transistor T1 by transmitting the initialization voltage VINT to the driving gate electrode G1 of the driving transistor T1.

An operation control gate electrode G5 of the operation control transistor T5 may be connected to the emission control line 133, an operation control source electrode S5 of the operation control transistor T5 may be connected to the driving voltage line 152, and an operation control drain electrode D5 of the operation control transistor T5 may be connected to the driving source electrode S1 of the driving transistor T1 and the switching drain electrode D2 of the switching transistor T2.

An emission control gate electrode G6 of the emission control transistor T6 may be connected to the emission control line 133, an emission control source electrode S6 of the emission control transistor T6 may be connected to the driving drain electrode D1 of the driving transistor T1 and the compensation source electrode S3 of the compensation transistor T3, and an emission control drain electrode D6 of the emission control transistor T6 may be connected to a second initialization source electrode S7 of the second initialization transistor T7 and the anode of the organic light emitting element OLED.

The operation control transistor T5 and the emission control transistor T6 may be simultaneously turned on in response to the emission control signal En applied thereto through the emission control line 133. Therefore, the driving voltage ELVDD may be transmitted to the organic light emitting element OLED, and the driving current $I_{OLED}$ may flow through the organic light emitting element OLED.

A second initialization gate electrode G7 of the second initialization transistor T7 may be connected to the previous scan line 132, a second initialization source electrode S7 of the second initialization transistor T7 may be connected to the emission control drain electrode D6 of the emission control transistor T6 and the anode of the organic light emitting element OLED, and a second initialization drain electrode D7 of the second initialization transistor T7 may be connected to the first initialization drain electrode D4 of the first initialization transistor T4 and the initialization voltage line 134. The second initialization transistor T7 may be turned on in response to the previous scan signal Sn−1 applied thereto through the previous scan line 132, and may initialize the anode of the organic light emitting element OLED.

An operation of each pixel PX will hereinafter be described in detail.

During an initialization period, when the previous scan signal Sn−1 is supplied through the previous scan line 132, the first initialization transistor T4 may be turned on in response to the previous scan signal Sn−1, and the driving transistor T1 may be initialized by the initialization voltage VINT supplied from the initialization voltage line 134.

During a data programming period, when the scan signal Sn is supplied through the scan line 131, the switching transistor T2 and the compensation transistor T3 may be turned on in response to the scan signal Sn. The driving transistor T1 may be diode-connected by the compensation transistor T3 that is turned on, and may be biased in a forward direction.

Then, a compensation voltage Dm+Vth obtained by subtracting a threshold voltage−Vth (here, the threshold voltage has a negative value) of the driving transistor T1 from the data signal Dm supplied from the data line 151 may be applied to the driving gate electrode G1 of the driving transistor T1. In this case, the driving voltage ELVDD and the compensation voltage Dm+Vth may be applied to opposite ends (or the first electrode Cst1 and a second electrode Cst2) of the storage capacitor Cst, such that charges corresponding to a voltage difference between opposite ends of the storage capacitor Cst are stored in the storage capacitor Cst.

During an emission period, the operation control transistor T5 and the emission control transistor T6 may be turned on in response to the emission control signal En supplied from the emission control line 133. The driving current $I_{OLED}$ based on a voltage difference between a voltage of the driving gate electrode G1 of the driving transistor T1 and the driving voltage ELVDD may be generated, and the driving current $I_{OLED}$ may be supplied to the organic light emitting element OLED through the emission control transistor T6.

Figure 3:
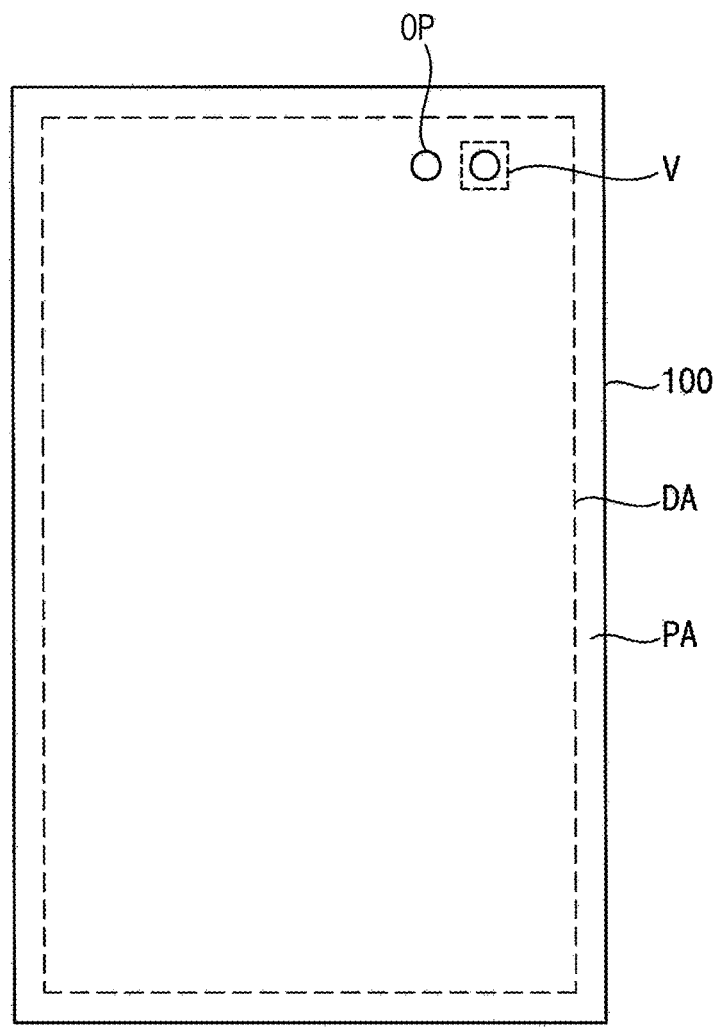
FIG. 3 is a plan view illustrating a display device according to an embodiment.

FIG. 3 is a plan view illustrating a display device according to an embodiment.

Referring to FIG. 3, an embodiment of a display device may include a substrate 100 including a display area DA and a peripheral area PA outside the display area DA. A plurality of pixels PX in FIG. 1, each including a display element such as an organic light emitting element, etc., and a plurality of lines SL1 through SLn, DTL1 through DTLm, EL1 through ELn, ELVDDL, and IL for transmitting electrical signals to the pixels may be disposed in the display area DA. Drivers 20, 30 and 40 in FIG. 1 for supplying the electrical signals to the display area DA may be disposed in the peripheral area PA.

The substrate 100 may include an opening OP defined in the display area DA. In an embodiment, the opening OP may have a substantially circular shape. However, the disclosure is not limited thereto, and in an alternative embodiment, the opening OP may have a polygonal shape or an oval shape, for example. In an embodiment, an optical device such as a camera, for example, may be disposed in the opening OP.

Figure 4:
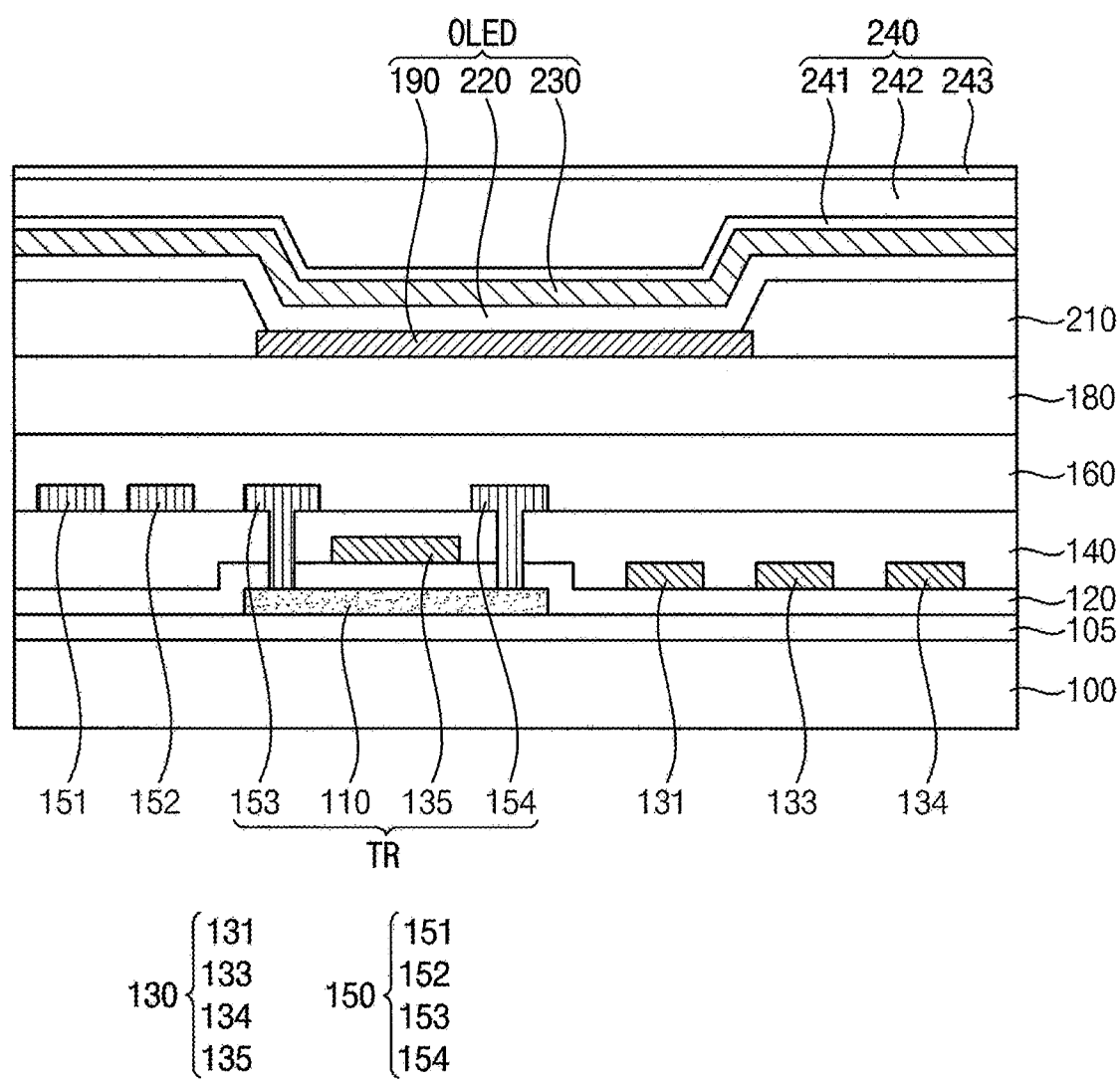
FIG. 4 is a cross-sectional view illustrating the display device in FIG. 3.

FIG. 4 is a cross-sectional view illustrating the display device in FIG. 3. Specifically, FIG. 4 may illustrate a portion of the display device in FIG. 3 including one pixel PX located in the display area DA.

Referring to FIG. 4, a transistor TR, signal lines 131, 133, 134, 151 and 152, insulation layers 105, 120, 140, 160, 180 and 210, an organic light emitting element OLED, and an encapsulation layer 240 may be disposed on the substrate 100.

The substrate 100 may include a glass, a metal, or a plastic. In an embodiment, the substrate 100 may include a material having flexible property or bendable property. In an embodiment, where the substrate 100 has the flexible property or the bendable property, the substrate 100 may include a polymer resin such as polyether sulfone ("PES"), polyacrylate ("PAR"), polyetherimide ("PEI"), polyethylene naphthalate ("PEN"), polyethylene terephthalate ("PET"), polyphenylene sulfide ("PPS"), polyarylate, polyimide ("PI"), polycarbonate ("PC") or cellulose acetate phthalate ("CAP"), for example. The substrate 100 may have a single-layer structure or a multilayer structure including a layer including at least one of the above-mentioned materials, and an inorganic layer. In an embodiment, the substrate 100 may have a structure including a first organic layer, an inorganic layer, and a second organic layer, which are stacked one on another.

A buffer layer 105 may be disposed on the substrate 100. The buffer layer 105 may include an inorganic material including an oxide or a nitride. The buffer layer 105 may provide a flat surface above the substrate 100, and may include an inorganic material such as silicon oxide, silicon nitride or silicon oxynitride.

A semiconductor layer 110 may be disposed on the buffer layer 105. The semiconductor layer 110 may include or be formed of polycrystalline silicon, amorphous silicon or an oxide semiconductor, for example.

The semiconductor layer 110 may include a channel region, and a source region and a drain region disposed at respective opposite sides of the channel region. In an embodiment, the source region and the drain region may be doped with impurities, and the impurities may include N-type impurities or P-type impurities.

A gate insulation layer 120 may be disposed on the semiconductor layer 110. The gate insulation layer 120 may include an inorganic material including an oxide or a nitride, or an organic material. In one embodiment, for example, the gate insulation layer 120 may include silicon oxide, silicon nitride, silicon oxynitride, aluminum oxide, titanium oxide, tantalum oxide, hafnium oxide or zinc oxide, for example, and may have a single-layer structure or a multilayer structure.

A first conductive layer 130 including the scan line 131, the emission control line 133, the initialization voltage line 134 and a gate electrode 135 may be disposed on the gate insulation layer 120. In an embodiment, the scan line 131, the emission control line 133, the initialization voltage line 134 and the gate electrode 135 may be disposed in a same layer as each other, and may include a same material as each other. In one embodiment, for example, the first conductive layer 130 may include molybdenum (Mo), copper (Cu) or titanium (Ti), for example, and may have a single-layer structure or a multilayer structure.

A first insulation layer 140 may be disposed on the first conductive layer 130. The first insulation layer 140 may include an inorganic material including an oxide or a nitride, or an organic material. In one embodiment, for example, the first insulation layer 140 may include silicon oxide, silicon nitride, silicon oxynitride, aluminum oxide, titanium oxide, tantalum oxide, hafnium oxide or zinc oxide, for example, and may have a single-layer structure or a multilayer structure.

A second conductive layer 150 including the data line 151, the driving voltage line 152, a source electrode 153, and a drain electrode 154 may be disposed on the first insulation layer 140. In an embodiment, the data line 151, the driving voltage line 152, the source electrode 153 and the drain electrode 154 may be disposed in a same layer as each other, and may include a same material as each other. In one embodiment, for example, the second conductive layer 150 may include aluminum (Al), copper (Cu) or titanium (Ti), for example, and may have a single-layer structure or a multilayer structure.

The semiconductor layer 110, the gate electrode 135, the source electrode 153 and the drain electrode 154 may collectively define the transistor TR. The transistor TR illustrated in FIG. 4 may correspond to any one of the driving transistor T1, the switching transistor T2, the compensation transistor T3, the first initialization transistor T4, the operation control transistor T5, the emission control transistor T6 and the second initialization transistor T7.

A second insulation layer 160 may be disposed on the second conductive layer 150. The second insulation layer 160 may include an inorganic material including an oxide or a nitride, or an organic material. In one embodiment, for example, the second insulation layer 160 may include silicon oxide, silicon nitride, silicon oxynitride, aluminum oxide, titanium oxide, tantalum oxide, hafnium oxide or zinc oxide, for example, and may have a single-layer structure or a multilayer structure.

A planarization layer 180 may be disposed on the second insulation layer 160. The planarization layer 180 may include an organic material such as acrylate, benzocyclobutene ("BCB)", PI or hexamethyldisiloxane ("HMDSO"), for example. The planarization layer 180 may serve to substantially planarize (or provide a flat surface on) a portion above the transistor TR. The planarization layer 180 may have a single-layer structure or a multilayer structure.

The organic light emitting element OLED including a pixel electrode 190, an opposite electrode 230, and an intermediate layer 220 interposed between the pixel electrode 190 and the opposite electrode 230 may be disposed on the planarization layer 180. The intermediate layer 220 may include an emission layer.

The pixel electrode 190 may be connected to the emission control drain electrode D6 in FIG. 2 of the emission control transistor T6 in FIG. 2 via a contact hole defined in the planarization layer 180.

A pixel defining layer 210 may be disposed on the planarization layer 180. In an embodiment, an opening portion corresponding to each pixel, that is, an opening portion exposing a central portion of the pixel electrode 190, may be defined through the pixel defining layer 210 to define a pixel. In such an embodiment, the pixel defining layer 210 may increase a distance between an edge of the pixel electrode 190 and the opposite electrode 230, thereby effectively preventing an occurrence of an arc or the like therebetween. In one embodiment, for example, the pixel defining layer 210 may include an organic material, such as PI HMDSO.

The intermediate layer 220 of the organic light emitting element OLED may include a low molecular material or a polymer material. In an embodiment, where the intermediate layer 220 includes the low molecular material, the intermediate layer 220 may have a stack structure including a hole injection layer ("HIL"), a hole transport layer ("HTL"), an emission layer ("EML"), an electron transport layer ("ETL") and an electron injection layer ("EIL"), each of which may have a single-layer structure or a multilayer structure. The intermediate layer 220 may include at least one of various organic materials, such as copper phthalocyanine ("CuPc"), N,N'-di(naphthalene-1-yl)-N,N'-diphenyl-benzidine ("NPB") or tris-8-hydroxyquinoline aluminum ("Alq3"), for example.

In an embodiment, where the intermediate layer 220 includes the polymer material, the intermediate layer 220 may include an HTL and an EML. In such an embodiment, the HTL may include PEDOT, and the EML may include a polymer such as poly-phenylenevinylene ("PPV") and polyfluorene. The intermediate layer 220 may include a common layer over a plurality of pixel electrodes 190, or may include a patterned layer corresponding to each of the pixel electrodes 190.

The opposite electrode 230 may be disposed above the display area. In an embodiment, the opposite electrode 230 may be a common layer covering a plurality of organic light emitting elements OLED, and may correspond to a plurality of pixel electrodes 190.

In an embodiment, the pixel electrode 190 and the opposite electrode 230 may be an anode and a cathode of the organic light emitting element OLED, respectively. However, the disclosure is not limited thereto, and in an alternative embodiment, the pixel electrode 190 and the opposite electrode 230 may be the cathode and the anode of the organic light emitting element OLED, respectively.

The encapsulation layer 240 may be disposed on the organic light emitting element OLED. Since the organic light emitting element OLED may be easily damaged by moisture or oxygen from an outside, the organic light emitting element OLED may be covered by the encapsulation layer 240. The encapsulation layer 240 may cover the display area, and a portion thereof may extend outside the display area. The encapsulation layer 240 may include a first inorganic encapsulation layer 241, an organic encapsulation layer 242, and a second inorganic encapsulation layer 243.

The first inorganic encapsulation layer 241 may cover the opposite electrode 230, and may include a ceramic, a metal oxide, a metal nitride, a metal carbide, indium oxide, tin oxide, indium tin oxide ("ITO"), silicon oxide, silicon nitride, and/or silicon oxynitride. Although not shown, in an alternative embodiment, other layers, such as a capping layer, may be interposed between the first inorganic encapsulation layer 241 and the opposite electrode 230. Since a shape of the first inorganic encapsulation layer 241 conforms to that of the underlying structure thereof, the first inorganic encapsulation layer 241 may not have a flat upper surface.

The organic encapsulation layer 242 may cover the first inorganic encapsulation layer 241, and an upper surface of the organic encapsulation layer 242 may be substantially planarized. Specifically, the upper surface of the organic encapsulation layer 242 may have at least a flat portion corresponding to the display area. The organic encapsulation layer 242 may include at least one material selected from metacrylate, polyester, polyethylene, polypropylene, PET, PEN, PC, PI, polyethylene sulfonate, polyoxymethylene, polyarylate, and HMDSO.

The second inorganic encapsulation layer 243 may cover the organic encapsulation layer 242, and may include a ceramic, a metal oxide, a metal nitride, a metal carbide, indium oxide, tin oxide, ITO), silicon oxide, silicon nitride, and/or silicon oxynitride.

In an embodiment, as described above, since the encapsulation layer 240 has a multilayer structure including the first inorganic encapsulation layer 241, the organic encapsulation layer 242, and the second inorganic encapsulation layer 243, although cracks are generated inside the encapsulation layer 240, the cracks may not be connected between the first inorganic encapsulation layer 241 and the organic encapsulation layer 242 or between the organic encapsulation layer 242 and the second inorganic encapsulation layer 243. Thus, the formation of a path through which moisture, oxygen, etc. permeate into the display area from the outside may be effectively prevented or minimized.

Figure 5:
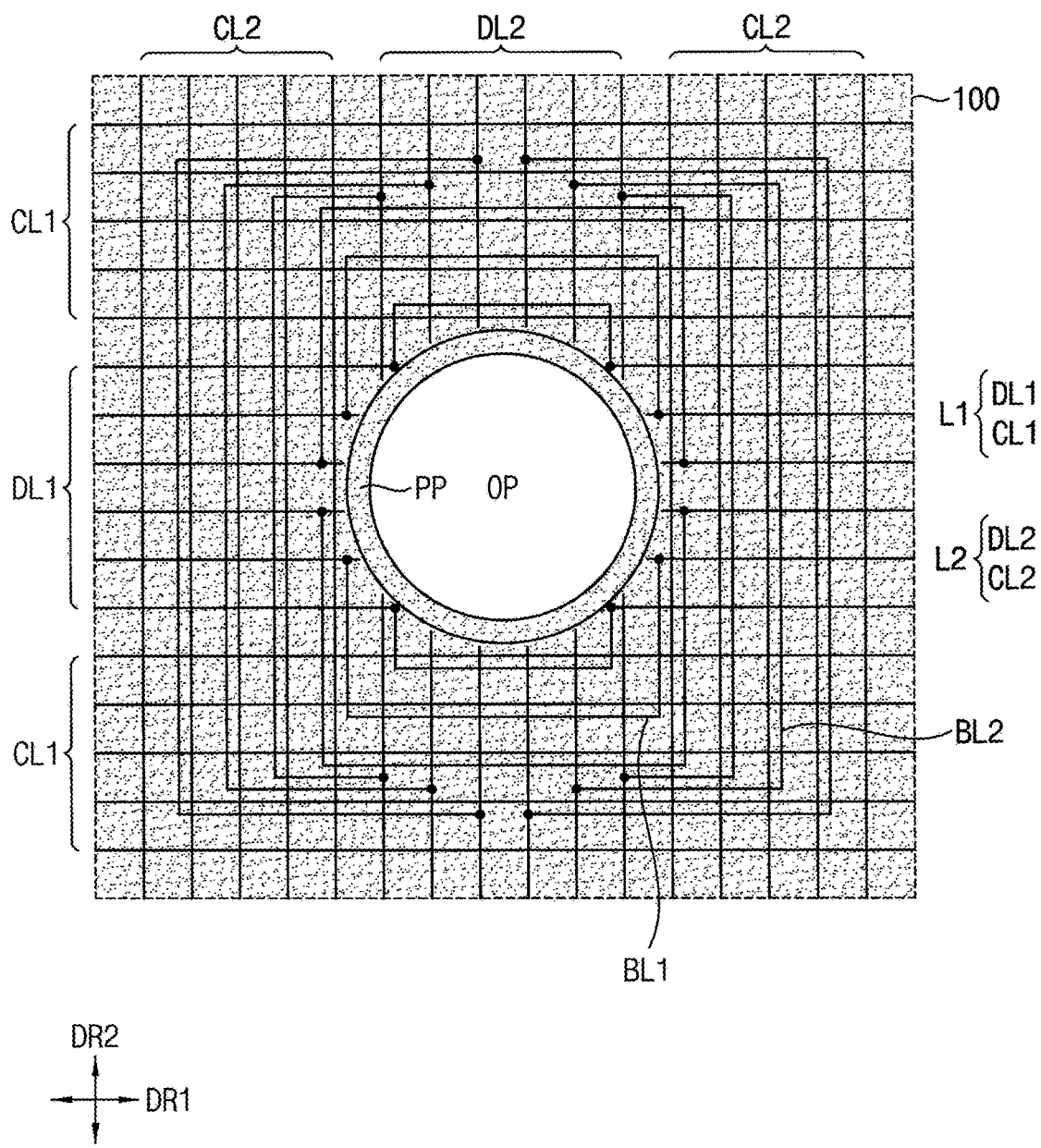
FIG. 5 is an enlarged plan view illustrating an area V in FIG. 3.
Figure 6:
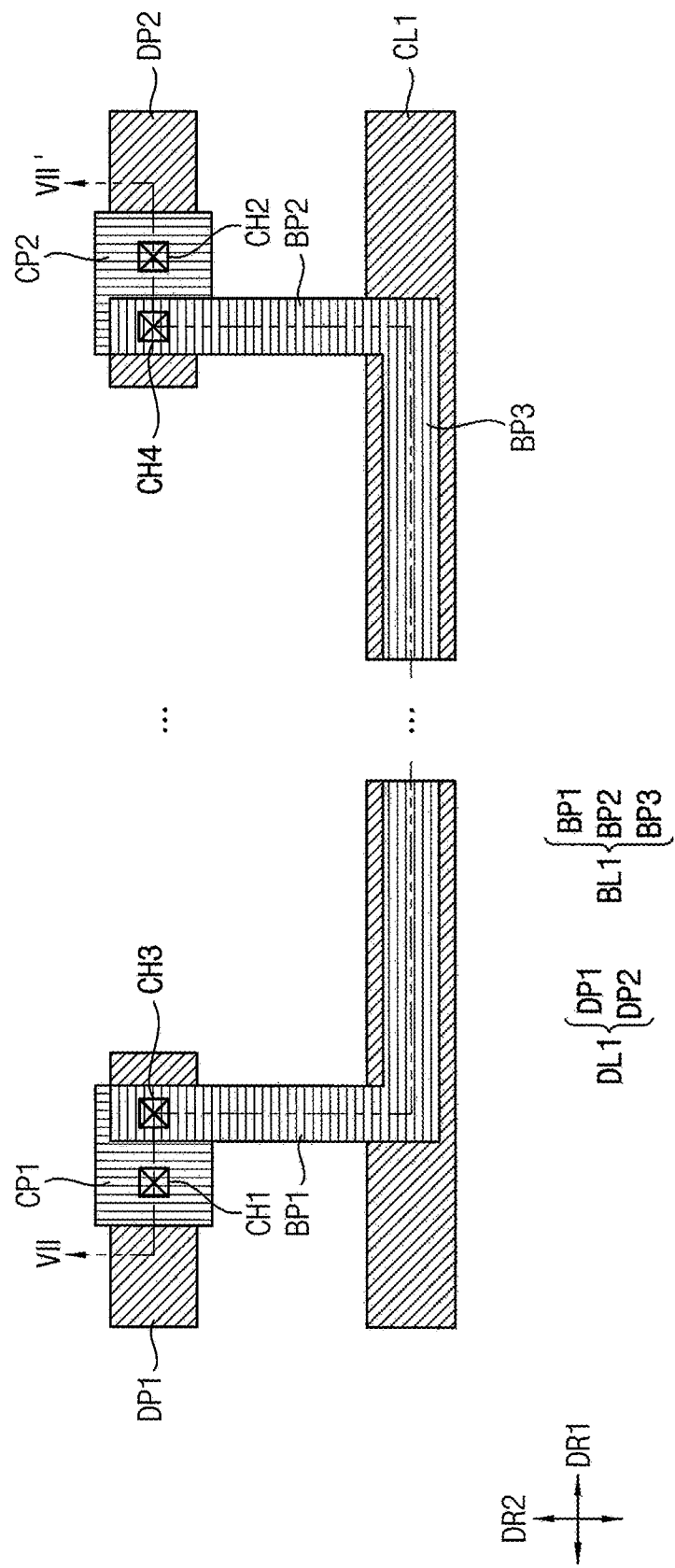
FIG. 6 is a plan view illustrating first lines in FIG. 5.
Figure 7:
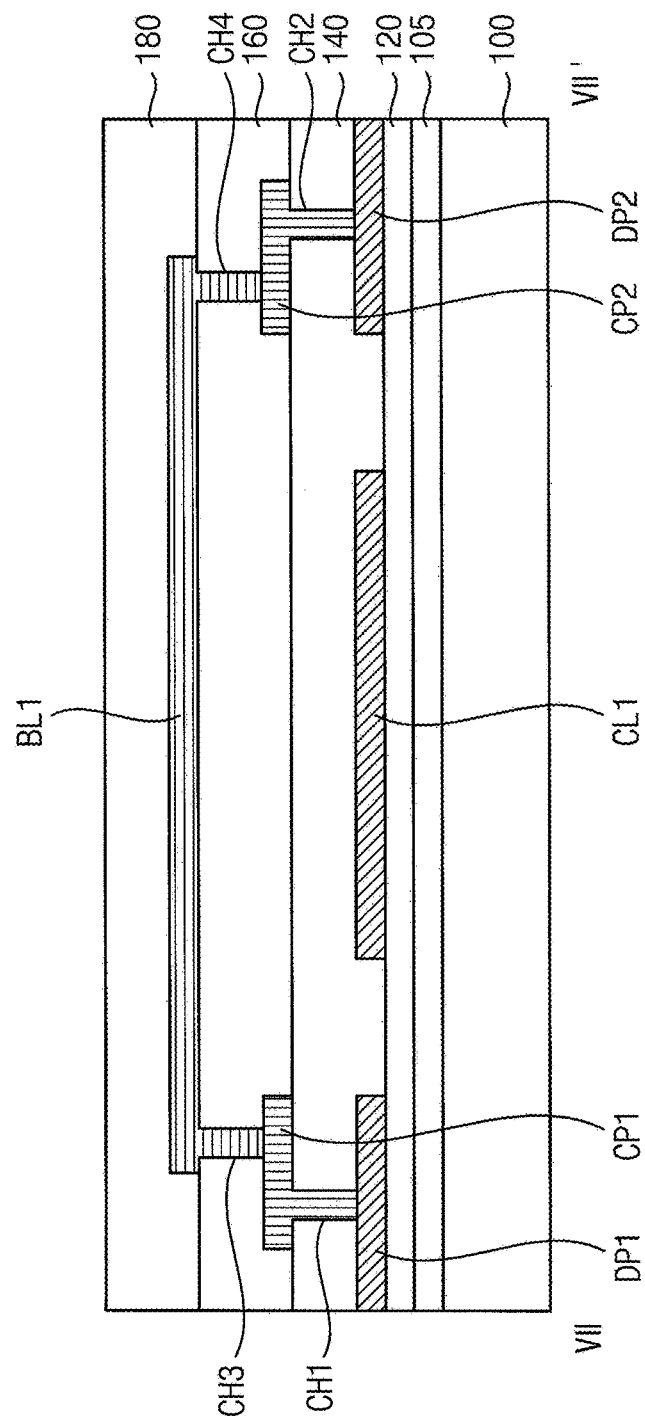
FIG. 7 is a cross-sectional view taken along line VII-VII' in FIG. 6.

FIG. 5 is an enlarged plan view illustrating an area V in FIG. 3. Specifically, FIG. 5 illustrates the opening OP of the substrate 100 and a peripheral area of the opening OP. FIG. 6 is a plan view illustrating first lines L1 in FIG. 5. FIG. 7 is a cross-sectional view taken along line VII-VII' in FIG. 6.

Figure 8:
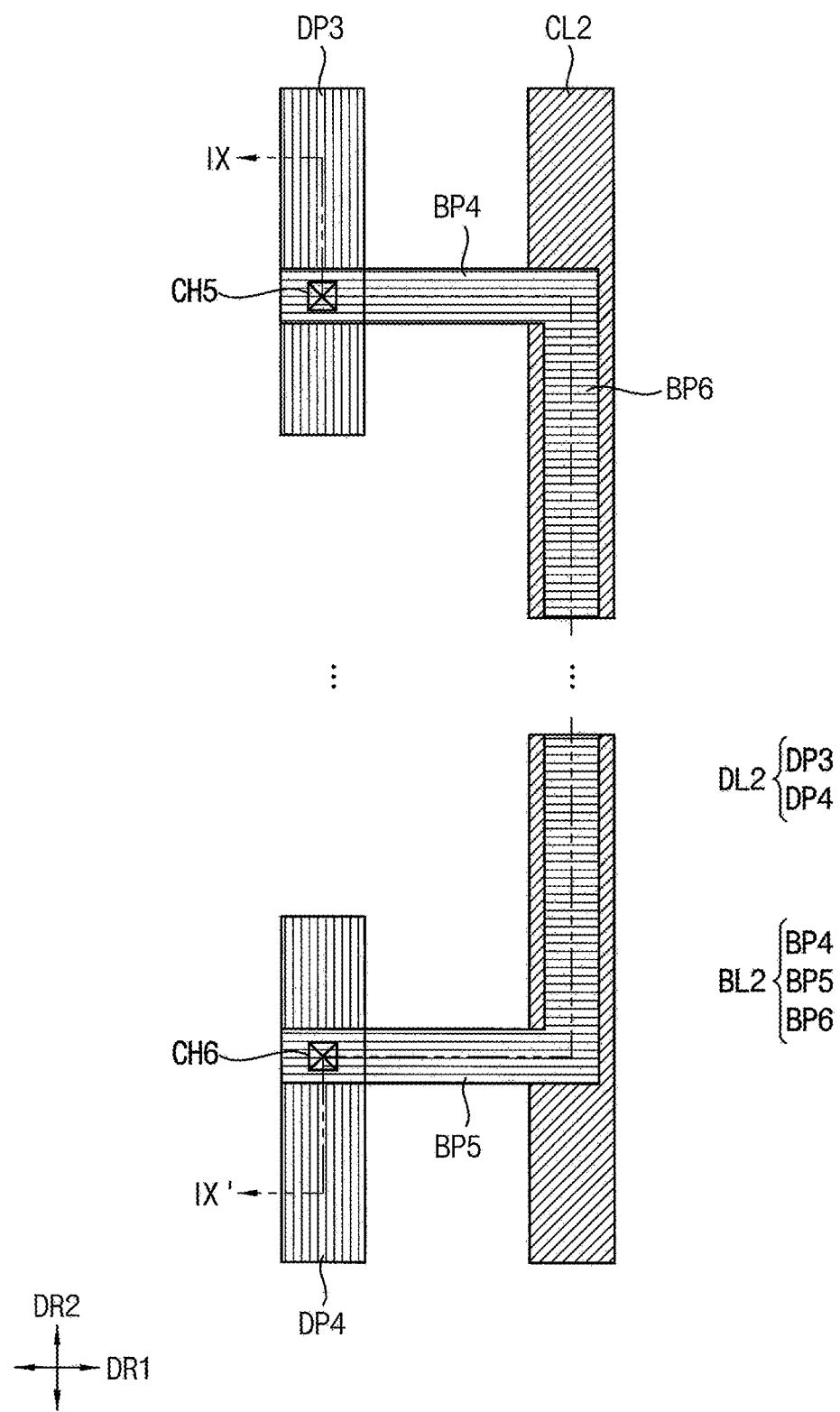
FIG. 8 is a plan view illustrating second lines in FIG. 5.
Figure 9:
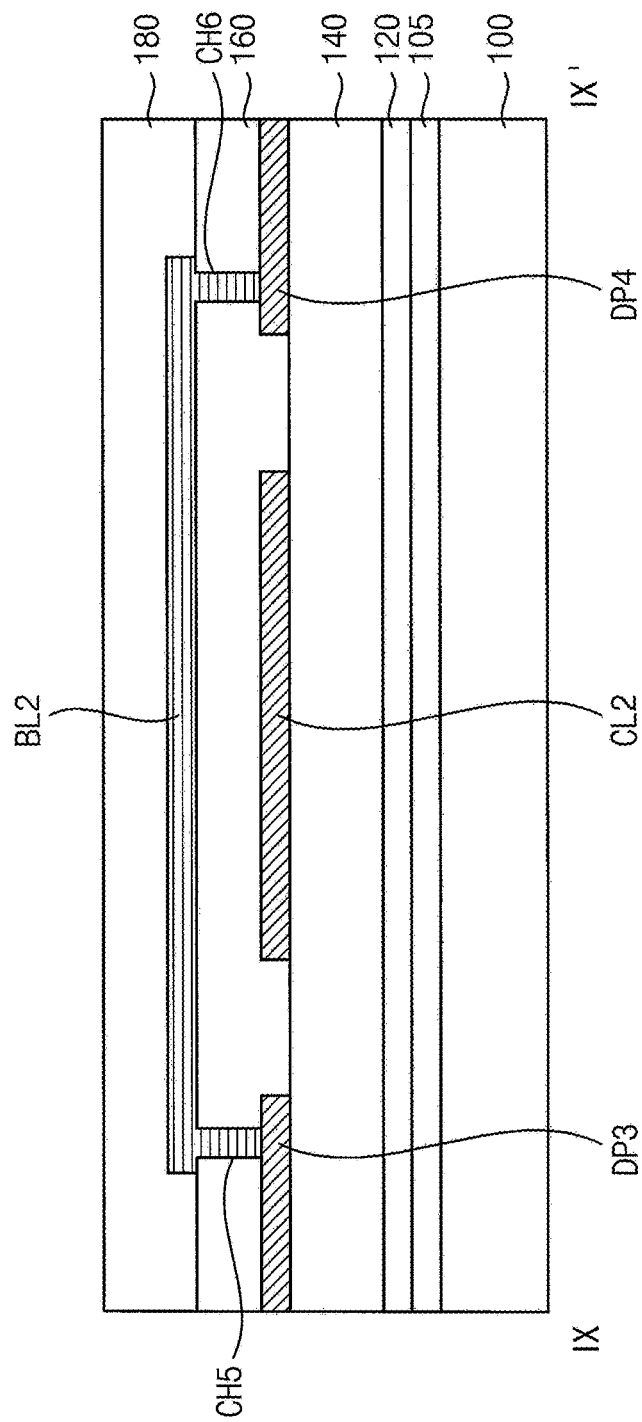
FIG. 9 is a cross-sectional view taken along line IX-IX' in FIG. 8.

FIG. 8 is a plan view illustrating second lines L2 in FIG. 5.
FIG. 9 is a cross-sectional view taken along line IX-IX' in FIG. 8.

Referring to FIGS. 5, 6, 7, 8, and 9, an embodiment of a display device may include the substrate 100 in which the opening OP is defined, and a plurality of first lines L1 and a plurality of second lines L2, which are disposed on the substrate 100.

The opening OP may be defined through the substrate 100, and the first lines L1 and the second lines L2 may not be disposed in the opening OP. In an embodiment, the opening OP may have a substantially circular shape having a diameter in a range from about 4.6 millimeters (mm) to about 4.8 mm. In one embodiment, for example, an inside of the display area of the substrate 100 may be cut into a circular shape to form the opening OP.

A peripheral portion PP surrounding the opening OP may be formed at the periphery of the opening OP. The peripheral portion PP may include a cutting margin for cutting the substrate 100 to form the opening OP. In an embodiment, the peripheral portion PP may have a substantially circular annular shape having a width in a range from about 0.3 mm to about 0.4 mm.

The first lines L1 may extend along the first direction DR1. In an embodiment, each of the first lines L1 may be the scan line 131 in FIG. 4, the emission control line 133 in FIG. 4, or the initialization voltage line 134 in FIG. 4. In such an embodiment, the first lines L1 may be disposed on the gate insulation layer 120.

In an embodiment, where the opening OP is defined or formed inside the display area, some of the first lines L1 extending along the first direction DR1 may be disconnected by the opening OP. Accordingly, the first lines L1 may include a plurality of first disconnected lines DL1 disconnected by the opening OP and a plurality of first connected lines CL1 not being disconnected by the opening OP. In such an embodiment, the first disconnected lines DL1 disconnected by the opening OP may be connected to each other by first bypass lines BL1 bypassing the opening OP, respectively.

In an embodiment, as shown in FIG. 6, each of the first disconnected lines DL1 may include a first disconnected portion DP1 and a second disconnected portion DP2 which are disconnected by the opening OP. The first disconnected portion DP1 and the second disconnected portion DP2 may be spaced apart in the first direction DR1 with the opening OP disposed therebetween.

The first bypass line BL1 may connect the first disconnected portion DP1 and the second disconnected portion DP2 with bypassing the opening OP. The first bypass line BL1 may include a first bypass portion BP1 extending along the second direction DR2 and connected to the first disconnected portion DP1, a second bypass portion BP2 extending along the second direction DR2 and connected to the second disconnected portion DP2, and a third bypass portion BP3 extending along the first direction DR1 and connecting the first bypass portion BP1 and the second bypass portion BP2 to each other. In one embodiment, for example, the first bypass line BL1 may have a "U-like" shape.

The first bypass line BL1 may be disposed in a different layer from the first disconnected line DL1. In an embodiment, the first bypass line BL1 may be disposed on the second insulation layer 160. In such an embodiment, the first bypass line BL1 may be electrically connected to the first disconnected line DL1 via connecting patterns CP1 and CP2 disposed on the first insulation layer 140.

In an embodiment, as shown in FIG. 7, the first connecting pattern CP1 may be in contact with the first disconnected portion DP1 by being disposed inside (e.g., filling) a first contact hole CH1 defined in the first insulation layer 140, and the second connecting pattern CP2 may be in contact with the second disconnected portion DP2 by being disposed inside (e.g., filling) a second contact hole CH2 defined in the first insulation layer 140. The first bypass portion BP1 may be in contact with the first connecting pattern CP1 by being disposed inside (e.g., filling) a third contact hole CH3 defined in the second insulation layer 160, and the second bypass portion BP2 may be in contact with the second connecting pattern CP2 by being disposed inside (e.g., filling) a fourth contact hole CH4 defined in the second insulation layer 160. Accordingly, the first bypass portion BP1 and the second bypass portion BP2 may be electrically connected to the first disconnected portion DP1 and the second disconnected portion DP2, respectively, and the first disconnected line DL1 may be connected to each other by the first bypass line BL1.

In an embodiment, the third bypass portion BP3 of the first bypass line BL1 may overlap one of the first connected lines CL1. In such an embodiment, the first connected line CL1 overlapping the third bypass portion BP3 may transmits a direct current voltage. In one embodiment, for example, the third bypass portion BP3 may overlap a first connected line CL1 that corresponds to the initialization voltage line, which transmits the initialization voltage, that is, a direct current voltage. If the first bypass line BL1 overlaps the scan line or the emission control line, which transmits an alternating current voltage such as the scan signal or the emission control signal, the first bypass line BL1 may be electrically coupled to the scan line or the emission control line. In an embodiment according to the invention, the third bypass portion BP3 of the first bypass line BL1 may overlap the first connected line CL1 for transmitting the direct current voltage, thereby effectively preventing the first bypass line BL1 from being electrically coupled to the first connected line CL1 located under the first bypass line BL1.

In a case, where a first bypass line is located in a same layer as that of the first disconnected line DL1, pixels may not be disposed in an area where the first bypass line is disposed to prevent the first bypass line from overlapping the scan line 131, the emission control line 133, the initialization voltage line 134 and the gate electrode 135 in FIG. 4, which are disposed on the gate insulation layer 120. Therefore, a dead space, in which the pixels are not located, may be formed around the opening OP. In an embodiment according to the invention, the first bypass line BL1 may be disposed on the second insulation layer 160 different from the gate insulation layer 120, on which the first disconnected line DL1 is disposed, such that pixels may be disposed in an area where the first bypass line BL1 is disposed. Accordingly, in such an embodiment, a dead space due to the first bypass line BL1 around the opening OP may be decreased or not be substantially formed.

The second lines L2 may extend along the second direction DR2 with being insulated from the first lines L1. In an embodiment, each of the second lines L2 may be the data line 151 in FIG. 4 or the driving voltage line 152 in FIG. 4. In such an embodiment, the second lines L2 may be disposed on the first insulation layer 140.

In such an embodiment, where the opening OP is defined or formed inside the display area, some of the second lines L2 extending along the second direction DR2 may be disconnected by the opening OP. Accordingly, the second lines L2 may include a plurality of second disconnected lines DL2 disconnected by the opening OP and a plurality of second connected lines CL2 not being disconnected by the opening OP. The second disconnected lines DL2 disconnected by the opening OP may be connected to each other by second bypass lines BL2 bypassing the opening OP, respectively.

Each of the second disconnected lines DL2 may include a third disconnected portion DP3 and a fourth disconnected portion DP4, which are disconnected from each other by the opening OP. The third disconnected portion DP3 and the fourth disconnected portion DP4 may be spaced apart in the second direction DR2 with the opening OP disposed therebetween.

The second bypass line BL2 may connect the third disconnected portion DP3 and the fourth disconnected portion DP4 to each other with bypassing the opening OP. The second bypass line BL2 may include a fourth bypass portion BP4 extending along the first direction DR1 and connected to the third disconnected portion DP3, a fifth bypass portion BP5 extending along the first direction DR1 and connected to the fourth disconnected portion DP4, and a sixth bypass portion BP6 extending along the second direction DR2 and connecting the fourth bypass portion BP4 and the fifth bypass portion BP5 to each other. In one embodiment, for example, the second bypass line BL2 may have a "U-like" shape.

The second bypass line BL2 may be disposed in a different layer from the second disconnected line DL2. In an embodiment, the second bypass line BL2 may be disposed on the second insulation layer 160. The fourth bypass portion BP4 may be in contact with the third disconnected portion DP3 by being disposed inside (e.g., filling) a fifth contact hole CH5 defined in the second insulation layer 160, and the fifth bypass portion BP5 may be in contact with the fourth disconnected portion DP4 by being disposed inside (e.g., filling) a sixth contact hole CH6 defined in the second insulation layer 160. Accordingly, the second disconnected line DL2 may be connected to each other by the second bypass line BL2.

In an embodiment, the second bypass line BL2 may be disposed on the substrate 100 in a same layer as that of the first bypass line BL1. In one embodiment, for example, the first bypass line BL1 and the second bypass line BL2 may be disposed on the second insulation layer 160. In such an embodiment, the first bypass line BL1 and the second bypass line BL2 may be spaced apart from each other to prevent the first bypass line BL1 and the second bypass line BL2 disposed in same layer as each other from being electrically connected to each other. In an embodiment, the second bypass line BL2 may be located outside the first bypass line BL1. In such an embodiment, the second bypass line BL2 may surround a portion of the first bypass line BL1. Accordingly, a length of the second bypass line BL2 may be greater than a length of the first bypass line BL1.

In an embodiment, the sixth bypass portion BP6 of the second bypass line BL2 may overlap one of the second connected lines CL2. In such an embodiment, the second connected line CL2 overlapping the sixth bypass portion BP6 may transmit a direct current voltage. In one embodiment, for example, the sixth bypass portion BP6 may overlap a second connected line CL2 that corresponds to the driving voltage line for applying the driving voltage, that is, a direct current voltage. If the second bypass line BL2 overlaps the data line which transmits an alternating current voltage such as the data signal, the second bypass line BL2 may be electrically coupled to the data line. In an embodiment of the invention, the sixth bypass portion BP6 of the second bypass line BL2 may overlap the second connected line CL2 that transmits the direct current voltage, thereby effectively preventing the second bypass line BL2 from being electrically coupled to the second connected line CL2 located under the second bypass line BL2.

In a case, where a second bypass line is located in a same layer as that of the second disconnected line DL2, pixels may not be disposed in an area where the second bypass line is disposed to prevent the second bypass line from overlapping the data line 151, the driving voltage line 152, the source electrode 153 and the drain electrode 154, which are disposed on the first insulation layer 140. Therefore, a dead space in which the pixels are not located may be formed around the opening OP. In an embodiment according to the invention, the second bypass line BL2 may be disposed on the second insulation layer 160 different from the first insulation layer 140, on which the second disconnected line DL2 is disposed, such that pixels may be disposed in an area where the second bypass line BL2 is disposed. Accordingly, a dead space due to the second bypass line BL2 around the opening OP may be decreased or not be substantially formed.

Figure 10:
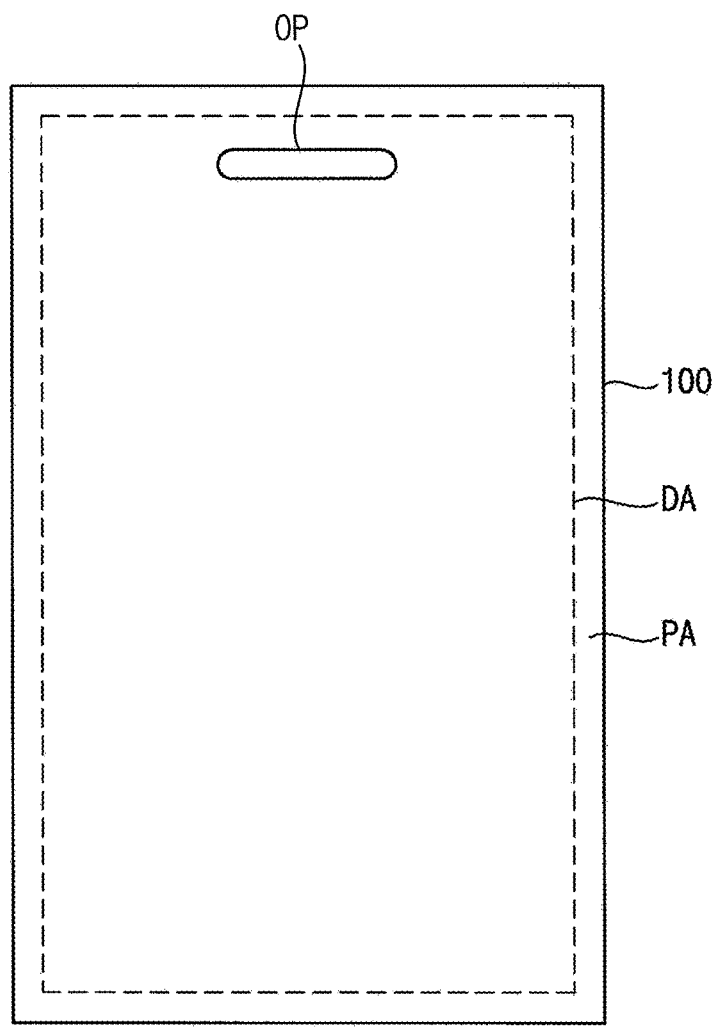
FIGS. 10 and 11 are plan views illustrating a display device according to alternative embodiments.
Figure 11:
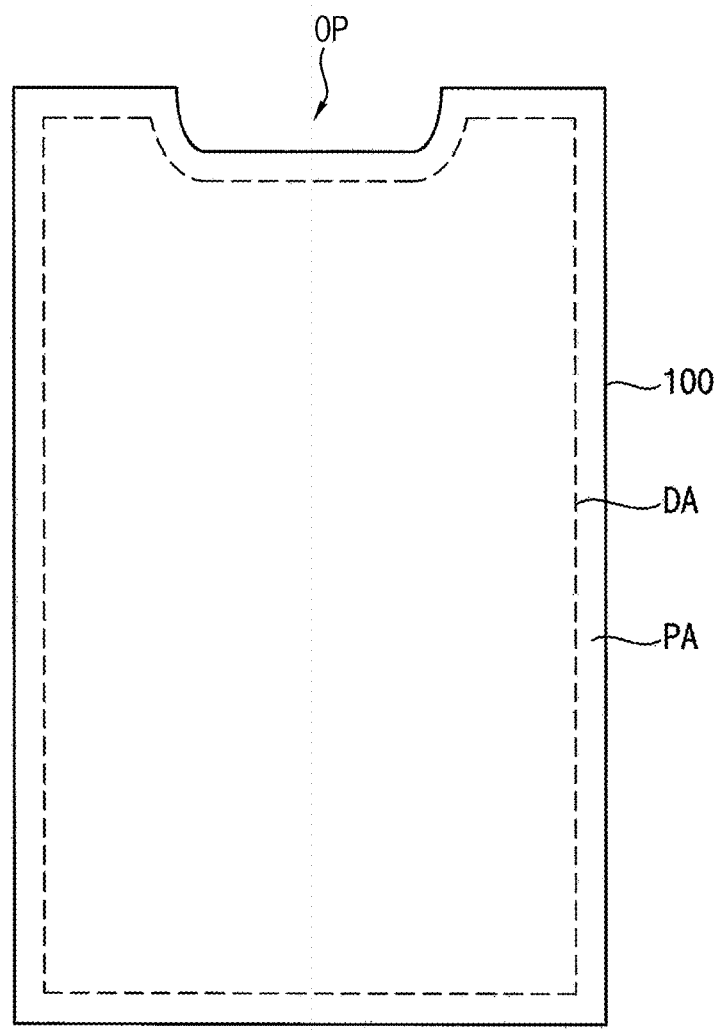

FIGS. 10 and 11 are plan views illustrating display devices according to alternative embodiments.

Referring to FIG. 10, in an alternative embodiment, the opening OP defined inside the display area DA may have a quadrilateral shape with rounded corners. In such an embodiment, a sound device, e.g., a speaker. may be disposed in the opening OP. In such an embodiment, the first disconnected line may be disconnected by the opening OP, and may be connected to each other by the first bypass line disposed in a different layer from the first disconnected line. In such an embodiment, the second disconnected line may be disconnected by the opening OP, and may be connected to each other by the second bypass line disposed in a different layer from the second disconnected line.

Referring to FIG. 11, in another alternative embodiment, the opening OP may be defined at a side portion of the substrate 100. In one embodiment, for example, the opening OP may have a recessed shape in which the opening OP is depressed from the side portion of the substrate 100 toward the inside of the substrate 100. In such an embodiment, the opening OP may be defined outside the display area DA. In such an embodiment, a device, e.g., a camera or a speaker, may be disposed in the opening OP In such an embodiment, the first disconnected line may be disconnected by the opening OP, and may be connected to each other by the first bypass line disposed in a different layer from the first disconnected line.

Such embodiments of the display device may be applied to a display device included in a computer, a notebook, a mobile phone, a smartphone, a smart pad, a portable media player ("PMP"), a personal digital assistant ("PDA"), an MP3 player, or the like.

The invention should not be construed as being limited to the exemplary embodiments set forth herein. Rather, these exemplary embodiments are provided so that this disclosure will be thorough and complete and will fully convey the concept of the invention to those skilled in the art.

While the invention has been particularly shown and described with reference to exemplary embodiments thereof, it will be understood by those of ordinary skill in the art that various changes in form and details may be made therein without departing from the spirit or scope of the invention as defined by the following claims.

What is claimed is:

1. A display device, comprising:
   a substrate in which an opening is defined;
   a first disconnected line disposed on the substrate, the first disconnected line extending along a first direction and including a first disconnected portion and a second disconnected portion, and the first disconnected portion and the second disconnected portion being disconnected from each other by the opening;
   a first bypass line disposed on the substrate in a different layer from the first disconnected line, the first bypass line bypassing the opening and connecting the first disconnected portion and the second disconnected portion to each other;
   a third disconnected line disposed on the substrate in a same layer as the first disconnected line, the third disconnected line extending along the first direction and including a fifth disconnected portion and a sixth disconnected portion, and the fifth disconnected portion and the sixth disconnected portion being disconnected from each other by the opening; and
   a second bypass line bypassing the opening;
   a third bypass line disposed on the substrate in a different layer from the third disconnected line, the third bypass line bypassing the opening and connecting the fifth disconnected portion and the sixth disconnected portion to each other,
   wherein the first bypass line bypasses the opening through a first side of the opening located in a second direction crossing the first direction from the opening, and the third bypass line bypasses the opening through a second side of the opening opposite to the first side of the opening with respect to the opening,
   wherein the first bypass line, the second bypass line and the third bypass line only extend in the first direction and the second direction, and the first, second and third bypass lines surround all sides defining the opening.

2. The display device of claim 1, wherein the first bypass line includes:
   a first bypass portion extending along the second direction crossing the first direction, the first bypass portion being connected to the first disconnected portion;
   a second bypass portion extending along the second direction, the second bypass portion being connected to the second disconnected portion; and
   a third bypass portion extending along the first direction, the third bypass portion connecting the first bypass portion and the second bypass portion.

3. The display device of claim 2, further comprising:
   a connected line disposed on the substrate in a same layer as the first disconnected line, the connected line extending along the first direction and not being disconnected by the opening,
   wherein the third bypass portion overlaps the connected line along an entire length of the third bypass portion extending in the first direction.

4. The display device of claim 3, wherein the connected line transmits a direct current voltage.

5. The display device of claim 1, wherein the first disconnected line is a scan line, an emission control line, or an initialization voltage line.

6. The display device of claim 1, further comprising:
   a second disconnected line disposed on the substrate in a different layer from the first disconnected line, the second disconnected line extending along the second direction crossing the first direction and including a third disconnected portion and a fourth disconnected portion, and the third disconnected portion and the fourth disconnected portion being disconnected from each other by the opening; and
   the second bypass line disposed on the substrate in a different layer from the second disconnected line, the second bypass line connecting the third disconnected portion and the fourth disconnected portion to each other.

7. The display device of claim 6, wherein the second bypass line includes:
   a fourth bypass portion extending along the first direction, the fourth bypass portion being connected to the third disconnected portion;
   a fifth bypass portion extending along the first direction, the fifth bypass portion being connected to the fourth disconnected portion; and
   a sixth bypass portion extending along the second direction, the sixth bypass portion connecting the fourth bypass portion and the fifth bypass portion to each other.

8. The display device of claim 7, further comprising:
   a connected line disposed on the substrate in a same layer as the second disconnected line, the connected line extending along the second direction and not being disconnected by the opening,
   wherein the sixth bypass portion overlaps the connected line.

9. The display device of claim 8, wherein the connected line transmits a direct current voltage.

10. The display device of claim 6, wherein the second disconnected line is a data line or a driving voltage line.

11. The display device of claim 6, wherein the second bypass line is disposed on the substrate in a same layer as the first bypass line.

12. The display device of claim 6, wherein a length of the second bypass line is greater than a length of the first bypass line.

13. The display device of claim 6, further comprising:
    a first conductive layer, a first insulation layer, a second conductive layer, a second insulation layer and a third conductive layer, which are sequentially stacked one on another on the substrate,
    wherein
    the first conductive layer includes the first disconnected line, and
    the third conductive layer includes the first bypass line.

14. The display device of claim 13, wherein:
    the second conductive layer includes the second disconnected line; and
    the third conductive layer further includes the second bypass line.

15. A display device, comprising:
    a substrate in which an opening is defined;
    a first line disposed on the substrate, the first line extending along a first direction and including a first disconnected line and a first connected line, the first disconnected line being disconnected by the opening, and the first connected line not being disconnected by the opening;
    a first bypass line disposed on the substrate in a different layer from the first line, the first bypass line bypassing the opening and connecting the first disconnected line;
    a third line disposed on the substrate in a same layer as the first line, the third line extending along the first direction and including a third disconnected line and a third connected line, the third disconnected line being disconnected by the opening, and the third connected line not being disconnected by the opening; and a third bypass line disposed on the substrate in a different layer from the third line, the third bypass line bypassing the opening and connecting the third disconnected line, wherein the first bypass line bypasses the opening through a first side of the opening located in a second direction crossing the first direction from the opening, and the third bypass line bypasses the opening through a second side of the opening opposite to the first side of the opening with respect to the opening, wherein entire portions of the first bypass line and third bypass line extending in the first direction overlap the first connected line and the third connected line, respectively.

16. The display device of claim 15, wherein the first disconnected line includes a first disconnected portion and a second disconnected portion which are spaced apart from each other with the opening therebetween, and the first bypass line includes:
- a first bypass portion extending along the second direction crossing the first direction, the first bypass portion being connected to the first disconnected portion;
- a second bypass portion extending along the second direction, the second bypass portion being connected to the second disconnected portion; and
- a third bypass portion extending along the first direction, the third bypass portion connecting the first bypass portion and the second bypass portion to each other.

17. The display device of claim 16, wherein the third bypass portion overlaps the first connected line along an entire length of the third bypass portion extending in the first direction.

18. The display device of claim 15, further comprising:
a second line disposed on the substrate in a different layer from the first line, the second line extending along the second direction crossing the first direction and including a second disconnected line and a second connected line, the second disconnected line being disconnected by the opening, and the second connected line not being disconnected by the opening; and a second bypass line disposed on the substrate in a different layer from the second line, the second bypass line bypassing the opening and connecting the second disconnected line.

19. The display device of claim 18, wherein the second disconnected line includes a third disconnected portion and a fourth disconnected portion which are spaced apart from each other with the opening therebetween, and the second bypass line includes:
- a fourth bypass portion extending along the first direction, the fourth bypass portion being connected to the third disconnected portion;
- a fifth bypass portion extending along the first direction, the fifth bypass portion being connected to the fourth disconnected portion; and
- a sixth bypass portion extending along the second direction, the sixth bypass portion connecting the fourth bypass portion and the fifth bypass portion to each other.

20. The display device of claim 19, wherein the sixth bypass portion overlaps the second connected line.

21. The display device of claim 18, further comprising:
a first conductive layer, a first insulation layer, a second conductive layer, a second insulation layer and a third conductive layer which are sequentially stacked one on another on the substrate, wherein
the first conductive layer includes the first line, and
the third conductive layer includes the first bypass line.

22. The display device of claim 21, wherein
the second conductive layer includes the second line, and
the third conductive layer further includes the second bypass line.

* * * * *